US006946901B2

(12) United States Patent
Kang et al.

(10) Patent No.: US 6,946,901 B2
(45) Date of Patent: Sep. 20, 2005

(54) LOW-POWER HIGH-PERFORMANCE INTEGRATED CIRCUIT AND RELATED METHODS

(75) Inventors: Sung-Mo Kang, Santa Cruz, CA (US); Seung-Moon Yoo, Austin, TX (US)

(73) Assignee: The Regents of the University of California, Oakland, CA (US)

(*) Notice: Subject to any disclaimer, the term of this patent is extended or adjusted under 35 U.S.C. 154(b) by 28 days.

(21) Appl. No.: 10/155,490

(22) Filed: May 22, 2002

(65) Prior Publication Data

US 2003/0030484 A1 Feb. 13, 2003

Related U.S. Application Data

(60) Provisional application No. 60/368,392, filed on Mar. 27, 2002, and provisional application No. 60/292,570, filed on May 22, 2001.

(51) Int. Cl.[7] .............................................. G05F 1/10
(52) U.S. Cl. ...................................................... 327/544
(58) Field of Search ................................. 327/205, 206, 327/534, 535, 544

(56) References Cited

U.S. PATENT DOCUMENTS

| | | | |
|---|---|---|---|
| 5,115,150 A | | 5/1992 | Ludwig |
| 5,151,620 A | * | 9/1992 | Lin .............................. 326/71 |
| 5,175,448 A | | 12/1992 | Fujii |
| 5,661,419 A | | 8/1997 | Bhagwan |
| 5,880,604 A | * | 3/1999 | Kawahara et al. ............. 326/83 |
| 6,049,245 A | * | 4/2000 | Son et al. .................... 327/544 |
| 6,107,869 A | * | 8/2000 | Horiguchi et al. ........... 327/544 |
| 6,191,615 B1 | * | 2/2001 | Koga ........................... 326/81 |
| 6,204,696 B1 | | 3/2001 | Krishnamurthy et al. |
| 6,370,052 B1 | | 4/2002 | Hsu et al. |
| 6,404,269 B1 | * | 6/2002 | Voldman ..................... 327/534 |
| 6,411,157 B1 | * | 6/2002 | Hsu et al. .................... 327/536 |
| 6,442,086 B1 | | 8/2002 | Dean |
| 6,492,837 B1 | | 12/2002 | Narendra et al. |
| 6,759,873 B2 | | 7/2004 | Kang et al. |

OTHER PUBLICATIONS

Assaderaghi et al., "A Dynamic Threshold Voltage MOSFET (DTMOS) for Ultra–Low Voltage Operation", *International Electron Devices Meeting, Digest of Technical Papers*, pp. 809–812, Jun. 1994.

J. Burr and J. Scott, "A 200mV Self–Testing Encoder/Decoder using Stanford Ultra–Low–Power CMOS", *ISSCC Digest of Technical Papers*, pp. 84–85, Feb. 1994.

M. Horiguchi et al., "Switched–Source–Impedance CMOS Circuit for Low Standby Subthreshold Current Giga–Scale LSI's", *IEEE Journal of Solid State Circuits*, 28(11):1131–1135, Nov. 1993.

T. Iwata et al., "Gate–Over–Driving CMOS Architecture for 0.5V Single–Power–Supply–Operated Devices", *ISSCC Digest of Technical Papers*, pp. 290–291, Feb. 1997.

(Continued)

*Primary Examiner*—Jeffrey Zweizig
(74) *Attorney, Agent, or Firm*—Morrison & Foerster LLP

(57) ABSTRACT

An integrated circuit is provided which includes a multi-state circuit with a first PMOS transistor and a first NMOS transistor. In an active mode, the multi-state circuit is operable to switch between a first state in which the first PMOS transistor is turned on and the first NMOS transistor is turned off and a second state in which the first PMOS transistor is turned off and the first NMOS transistor is turned on. A power source NMOS transistor has a drain connected to a supply voltage terminal and has a source connected to a source of the first PMOS transistor. A power source PMOS transistor has a drain connected to a an effective ground terminal and has a source connected to a source of the first NMOS transistor.

13 Claims, 11 Drawing Sheets

OTHER PUBLICATIONS

Kawaguchi et al., "A CMOS Scheme for 0.5V Supply Voltage with Pico-Ampere Standby Current", *ISSCC Digest of Technical Papers*, pp. 192–193, Feb. 1998.

T. Kuroda et al., "A 0.9V 150MHz 10mW 4mm$^2$ 2D Discrete Cosine Transform Core Processor with Variable-Threshold-Voltage Scheme", *ISSCC Digest of Technical Papers*, pp. 166–167, Feb. 1996.

Mutoh et al., "1-V Power Supply High-Speed Digital Circuit Technology with Multithreshold-Voltage CMOS", *IEEE Journal of Solid State Circuits*, 30(8): 845–854, Aug. 1995.

K. Seta et al., "50% Active-Power Saving without Speed Degradation Using Standby Power Reduction (SPR) Circuit", in *ISSCC Digest of Technical Papers*, pp. 318–319, Feb. 1995.

S. Shigematsu et al., "A 1-V High-Speed MTCMOS Circuit Scheme for Power-Down Application Circuits", *IEEE Journal of Solid State Circuits*, 32(6):861–869, Jun. 1997.

Seung-Moon Yoo et al., "New High Performance Sub-1V Circuit Technique with Reduced Standby Current and Robust Data Holding", IEEE International Symposium on Circuits and Systems, May 28–31, 2000, Geneva, Switzerland (pp. 1–4).

U.S. Appl. No. 10/153,158, filed May 21, 2002, Yoo et al.

Mark N. Horenstein, Microelectronic Circuits & Devices, 1996, pp. 240–250.

M. Anis et al., "Dynamic and Leakage Power Reduction in MTCMOS Circuits Using an Automated Efficient Gate Clustering Technique", IEEE, Jun. 10–14, 2002, New Orleans, Louisiana, pp. 480–485.

International Search Report mailed on Feb. 25, 2004, for PCT/US03/24976 filed on Aug. 8, 2003, 7 pgs.

* cited by examiner

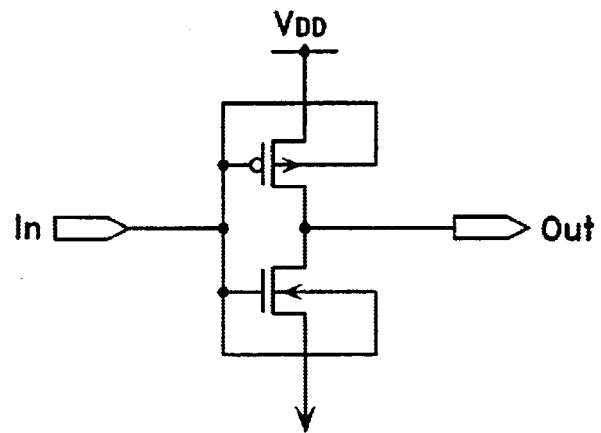
Fig. 3 (PRIOR ART)
Fig. 4
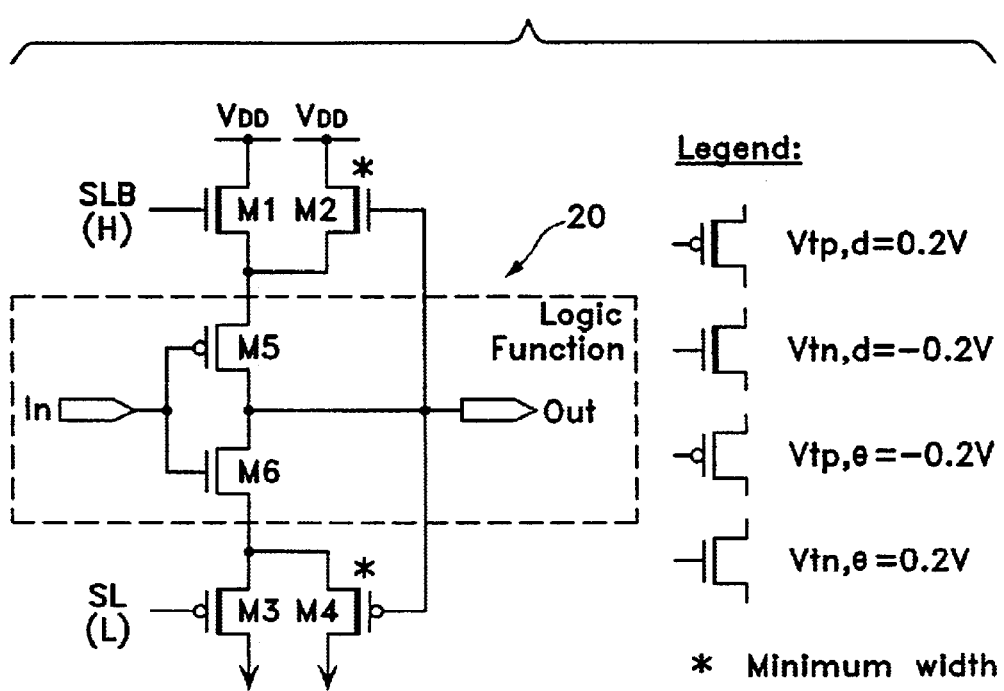

LOW-POWER HIGH-PERFORMANCE INTEGRATED CIRCUIT AND RELATED METHODS

CROSS-REFERENCE TO RELATED APPLICATIONS

This application claims priority to and the benefit of the filing date of provisional patent application Ser. No. 60/368,392 filed Mar. 27, 2002 and to the provisional patent application Ser. No. 60/292,570 filed May 22, 2001, both incorporated herein in their entirety by reference.

BACKGROUND OF THE INVENTION

1. Field of the Invention

The invention relates to integrated circuits, and more particularly, to integrated circuits with low power consumption.

2. Description of the Related Art

As power consumption and device reliability are of increasing concern in densely integrated circuits and systems, the supply voltage has been scaled down and is expected to be less than 1V in circuits used in lower power consumption devices such as portable computers, mobile telephones and personal digital assistants (PDAs), for example. Unfortunately, using a lower voltage can result in performance degradation due to reduced $|V_{gs}|$ and an increase of standby current due to scaled threshold voltages of transistors. Various circuit techniques have been proposed to solve the problems caused by reduced supply voltages in sub-1V region. MOS (metal-oxide-semiconductor) parameters such as the threshold voltages, and the gate and source voltages of transistors have been controlled to achieve the design goals. MOS-threshold-voltage-control techniques include: MTCMOS (Multi-Threshold CMOS), described in S. Mutoh et al, *IEEE Journal of Solid State Circuits*, 30(8): 845–854, August 1995; VTCMOS (Variable Threshold CMOS), described in T. Kuroda et al, *ISSCC Digest of Technical Papers*, pages 166–167, February 1996, and K. Seta et al, in *ISSCC Digest of Technical Papers*, pages 318–319, February 1995; and DTMOS (Dynamic Threshold-voltage MOS), described in F. Assaderaghi et al, in *International Electron Devices Meeting, Digest of Technical Papers*, pages 809–812, June 1994. MOS-gate-voltage-control techniques include: Gate-Over-Driving CMOS described in, T. Iwata et al, in *ISSCC Digest of Technical Papers*, pages 290–291, February 1997; and SCCMOS(Super Cut-Off CMOS), described in Kawaguchi et al. in *ISSCC Digest of Technical Papers*, pages 192–193, February 1998. A MOS-source-voltage-control technique includes: Switched-Source-Impedance CMOS, described in M. Horiguchi et al, *IEEE Journal of Solid State Circuits*, 28(11):1131–1135, November 1993. Even though previous techniques have shown potential solutions they also have drawbacks such as, limitations relating to low supply voltage, complicated data holding schemes and/or an on-chip boost voltage generator, and gate oxide reliability problems, for example.

FIG. 1 is an illustrative circuit diagram showing a basic MTCMOS type circuit. MOS transistors with different threshold voltages Vt are used to improve performance in the active mode while reducing leakage current in standby mode. In particular, low Vt transistors provide rapid switching performance in an active mode, and high Vt transistors serve to reduce subthreshold leakage current in the standby mode. The low Vt transistors shown in FIG. 1 within dashed lines are interconnected as one or more multi-state logic circuits that perform logic functions or data storage functions. Transistor Q1 is a high Vt PMOS transistor, and transistor Q2 is a high Vt NMOS transistor. During active mode, Q1 and Q 2 are turned on, and the multi-state logic circuits are active and can perform logical or data storage functions. During standby mode, Q1 and Q2 are turned off, and the multi-state circuits become inactive.

There have been shortcomings with MTCMOS type circuits. For example, it will be appreciated that an MTCMOS circuit has a lower limit of supply voltage due to the presence of higher Vt transistors. In other words, the threshold higher voltage sets a lower limit on the supply voltage level. In general, the higher the threshold voltage is, the higher the lower limit of the supply voltage is. Also, relatively large transistor sizes for Q1 and Q2 may be required to meet performance requirements (e.g. current flow) in the sub-1V region. In addition, since virtual power lines (VDDV and GNDV) float in standby mode, special data holding circuitry such as a balloon circuit may be needed to preserve data safely in a standby mode. An example of a suitable data holding circuit is described in, S. Shigematsu et al, *IEEE Journal of Solid State Circuits*, 32(6):861–869, June 1997.

Thus, one of the impediments to lower voltage integrated circuits has been increased leakage current in the lower Vt transistors. One earlier approach to reducing leakage current through PMOS transistors (such as a PMOS transistor in the position of Q1 in FIG. 1) without employing a high Vt transistor has been to use an on-chip boost voltage ($V_{PP}$) for the control signal (SL) and control signal bar (SLB) as in Gate-Over-Driving CMOS and SCCMOS (Super Cut-Off CMOS). In standby mode, since the control signal voltage is $V_{PP}$(~1.5Vdd). Q1 would be reverse biased, and the leakage current would be suppressed. But these MOS-gate-control methods generally require N-well separation and a highly efficient on-chip boost voltage generator which can be difficult to achieve in sub-1V region. Oxide reliability is another problem. Since logic state information can be lost in standby mode MTCMOS, and SCCMOS may include a flip-flop with a high Vt SRAM cell for data holding in standby mode.

MOS threshold voltages also can be controlled by adjusting the substrate bias voltages as in a VTCMOS, circuit or in a DTMOS circuit. As shown in FIG. 2, for example, different substrate bias voltages can be applied by a self substrate bias generator so as to produce a low threshold voltage in active mode and a high threshold voltage in standby mode. VTCMOS techniques, however, ordinarily require a relatively large supply voltage to change the threshold voltage by a few hundred mV since changes in the threshold voltage generally depend on the square root of the source to substrate voltage. Other problems can arise due to a triple well structure and/or due to additional power lines for well bias and due to slow response time to well bias changes.

As shown in FIG. 3, in DTMOS, threshold voltages are changed dynamically according to an input state. Even though this scheme can possibly lower the supply voltage further, it typically involves silicon-on-insulator (SOI) technology which can suffer from increased leakage current due to inherent forward bias current of pn-junctions as explained by Kawaguchi, et al.

Thus, there as been a need for low power consumption high performance circuits. The present invention meets that need.

SUMMARY OF THE INVENTION

In one aspect of the invention, a circuit provides significant suppression of leakage current by self reverse-biased transistors.

In another aspect, a circuit provides robust data holding by use of feedback transistors in standby mode while keeping high performance in active mode.

In another aspect, a circuit provides performance comparable to logic circuits using only low Vt transistors.

In another aspect, a circuit and associated method employ ordinary enhancement transistors to achieve high performance in an active mode and low power consumption in a standby mode.

In another aspect, an integrated circuit is provided which includes a multi-state circuit with a first PMOS transistor and a first NMOS transistor. In an active mode, the multi-state circuit is operable to switch between a first state in which the first PMOS transistor is turned on and the first NMOS transistor is turned off and a second state in which the first PMOS transistor is turned off and the first NMOS transistor is turned on. A power source NMOS transistor has a drain connected to a supply voltage terminal and has a source connected to a source of the first PMOS transistor. A power ground source PMOS transistor has a drain connected to a an effective ground terminal and has a source connected to a source of the first NMOS transistor.

In another aspect, a method of limiting power consumption during operation of the above circuit is provided. The method encompasses active mode operation and standby mode operation. During active mode operation, a turn on voltage signal is provided to a gate of the power source NMOS device that is higher than the multi-state circuit supply voltage bias. Also during active mode operation, a turn on voltage signal is provided to a gate of the power source PMOS device that is lower than the multi-state circuit effective ground bias voltage. During standby mode operation, a turn off voltage signal is provided to a gate of the power source NMOS device that is not as low as the turn on voltage signal provided to the gate of the power ground source PMOS device in the active mode. Also during standby mode operation, a turn off voltage signal is provided to a gate of the power ground source PMOS device that is not as high as the turn on voltage signal provided to the gate of the power source NMOS device in the active mode.

Therefore, the present invention provides circuits and methods to that achieve both low power consumption and high performance

BRIEF DESCRIPTION OF THE DRAWINGS

FIG. 3 is an illustrative circuit diagram of a DTMOS circuit in which threshold voltages are changed dynamically according to an input state.

FIG. 4 is an illustrative circuit diagram of a first embodiment of a circuit in accordance with one aspect of the present invention.

FIG. 5 is an illustrative circuit diagram of the circuit of FIG. 4 together with bias condition waveforms for node "A" for input 'High' in standby mode in which M5 is turned off and M6 is turned on.

DETAILED DESCRIPTION OF THE PREFERRED EMBODIMENTS

Figure 1:
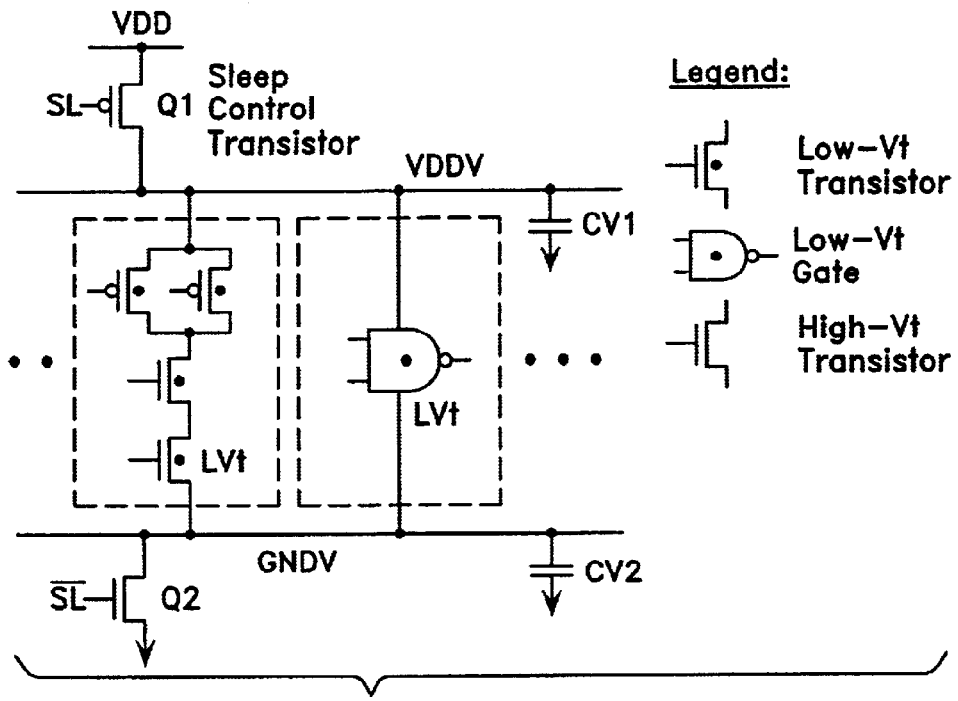
FIG. 1 is an illustrative circuit diagram of an earlier MTCMOS type circuit.
Figure 2:
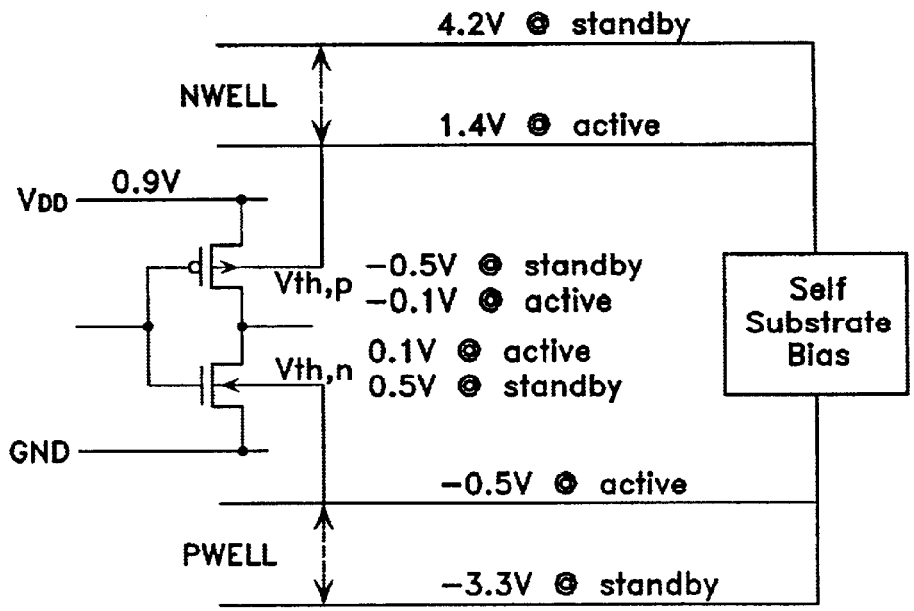
FIG. 2 is an illustrative diagram of a circuit that produces substrate bias voltages using a self substrate bias generator so as to produce a low threshold voltage in active mode and a high threshold voltage in standby mode.

The present invention provides a novel integrated circuit that can exhibit high-performance (high-speed) operation in an active mode, can significantly suppress subthreshold leakage current in a standby mode, and can operate with a relatively low (less than 1V) supply voltage. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

FIG. 4 is an illustrative circuit diagram which shows a first embodiment of a circuit 20 in accordance with one aspect of the present invention. The novel circuit 20 includes two sets of depletion transistors and a multi-state circuit comprising enhancement transistors. The multi-state circuit can change states in an active mode, but should not change states in a standby mode. During operation in the active mode the one set of depletion transistors provide significant drive capability due to their high Vgs voltages. During operation in a standby mode, depending upon the state of the multi-state circuit, one or the other of the depletion transistors of one set of serves to reduce leakage current through a novel self-reverse biasing scheme. In addition, one or the other of the depletion transistors of the other set serves to sustain the state of the multi-state circuit in a standby mode.

A transistor is a depletion transistor if the transistor is turned on even when a gate-to-source voltage (Vgs) is 0v. An NMOS depletion device can be produced by implanting n-type impurities in the transistor's channel region such that strong channel conduction can be achieved even with Vgs= 0. Similarly, a PMOS depletion device can be produced by implanting p-type impurities in the transistor's channel region such that strong channel conduction can be achieved even with Vgs=0.

As an alternative, 'leaky' enhancement transistors can be used instead of the depletion transistors. A leaky enhancement transistor as the term is used herein means an enhancement transistor having insufficient current driving capability to change a state of a node within a given timing constraint but having larger current than the junction leakage current of the node.

The multi-state circuit includes a first PMOS transistor M5 and a first NMOS transistor M6. In the illustrated embodiment, the first PMOS and first NMOS transistors are interconnected to perform an inverter logic function. The inverter comprising the first PMOS transistor M5 and first NMOS transistor M6 can actively switch back and forth between a first state in which the first PMOS transistor M5 is turned on and the first NMOS transistor M6 is turned off and a second state in which the first PMOS transistor M5 is turned off and the first NMOS transistor M6 is turned on. A second NMOS transistor M1 has a drain connected to a VDD supply terminal and has a source connected to a source of the first PMOS transistor M5. A second PMOS transistor M3 has a drain connected to a $V_{SS}$ terminal and a source connected to a source of the first NMOS transistor M6. A first standby sustaining NMOS pull-up transistor M2 has a drain connected to a VDD supply terminal and has a source connected to a source of the first PMOS transistor M5 and has a gate connected to an output terminal of the multi-state circuit. A first standby sustaining pull-down PMOS transistor M4 has a drain connected to a VSS terminal and a source connected to a source of the first NMOS transistor M6 and has a gate connected to an output terminal of the multi-state circuit.

Transistors M5, M6 of the multi-state circuit receive inputs on their respective gate terminals. In the case of the multi-state logic circuit of FIG. 4, the gate of the first PMOS transistor M5 and the gate of the first NMOS transistor M6, receive the same logic input. When the multi-state circuit is in an active mode, provision of a logic 0 value on the gates of M5 and M6 switches the circuit to the first state in which a logic 1 value is provided on the output terminal of the multi-state circuit. When the multi-state circuit is in an active mode, provision of a logic 1 value on the gates of M5 and M6 switches the circuit to the second state in which a logic 0 value is provided on the output terminal of the multi-state circuit.

The second PMOS transistor M1 and the second NMOS transistor M3 are configured to turn on together and to turn off together. In a present embodiment, the second PMOS transistor M1 and the second NMOS transistor M3 respectively receive control signal (SL) and control signal bar (SLB) on their gates so that both are in the same state whether it be on or off. The second PMOS and second NMOS transistors M1 and M3 control the active/standby mode of the multi-state circuit. When the second PMOS and second NMOS transistors M1, M3 are turned on, the multi-state circuit is in an active mode. When the second PMOS and second NMOS transistors M1, M3 are turned off, the multi-state circuit is in a standby mode.

The first pull-up NMOS transistor M2 and the first pull-down PMOS transistor M4 serve to sustain an output state of the multi-state circuit during the standby mode. Ideally, M2 and M4 serve to maintain the multi-state circuit output at the same logic level and voltage value that the output was at when the multi-state circuit entered the standby mode. On the one hand, if the multi-state circuit was in a first (logical 0 input) state when it entered standby mode, then pull-up NMOS transistor M2 turns on during the standby mode, and serves to maintain the multi-state circuit output at a logical 1 level by providing an output-sustaining path through M2 and M5 as explained more fully below. On the other hand, if the multi-state circuit was in a second (logical 1 input) state when it entered standby mode, then pull-down PMOS transistor M4 turns on during standby mode, and serves to maintain the multi-state circuit output at a logical 0 level by providing an output-sustaining path through M4 and M6 as explained more fully below.

In the embodiment 20 shown in FIG. 4, the multi-state circuit performs an inventor logic function. However, it will be appreciated that the multi-state circuit may include transistors interconnected to perform any function or a storage function. Regardless of the specific logical or storage functions of the multi-state circuit and regardless of the presence of additional transistors connected within the multi-state circuit, it is the reverse-biasing of a depletion (or alternatively, a 'leaky' enhancement) transistor M1 and enhancement transistor M5 that reduces leakage current when the circuit enters the standby mode in one logical state (the second state in the present inventor embodiment). Conversely, it is the reverse biasing of a depletion (or alternatively, a 'leaky' enhancement) transistor M3 and an enhancement transistor M6 that suppresses leakage current when the circuit enters the standby mode from the other logical state (the first state in the present inventor embodiment).

Thus, M1 and M3 serve as power and power ground source transistors when the multi-state circuit is in active mode, and they serve as self reverse-biased cut-off transistors when the multi-state circuit is in standby mode. M2 and M4 are fabricated so as to have relatively small sizes and are used for safe data holding in standby mode. It will be appreciated that depletion transistors (M1–M4) can be produced with little or no process changes by modifying the implantation mask for Vt adjustment to exclude these transistors. For example, refer to J. Burr and J. Scott, in *ISSCC Digest of Technical Papers*, pages 84–85, February 1994.

FIG. 4 shows the bias condition of M1, M3 in active mode. Basically SLB is high and SL is low, causing both power source transistors (M1 and M3) to be turned on. Since power and power ground source transistors are depletion transistors, the logic or storage functions of the multi-state circuit is evaluated at full strength without performance degradation. The relatively high $|V_{gs}|$ of these depletion devices results in their having significant current driving ability. Thus, the enhancement transistors of the multi-state circuit operate at substantially their full Vgs voltage swings. Also, logic evaluation performance is hardly affected by feedback M2, M4 due to their small sizes. Depending on the nature of multi-state logic operation, it is conceivable that both M2 and M4 be left out, especially for fast operation.

Figure 5:
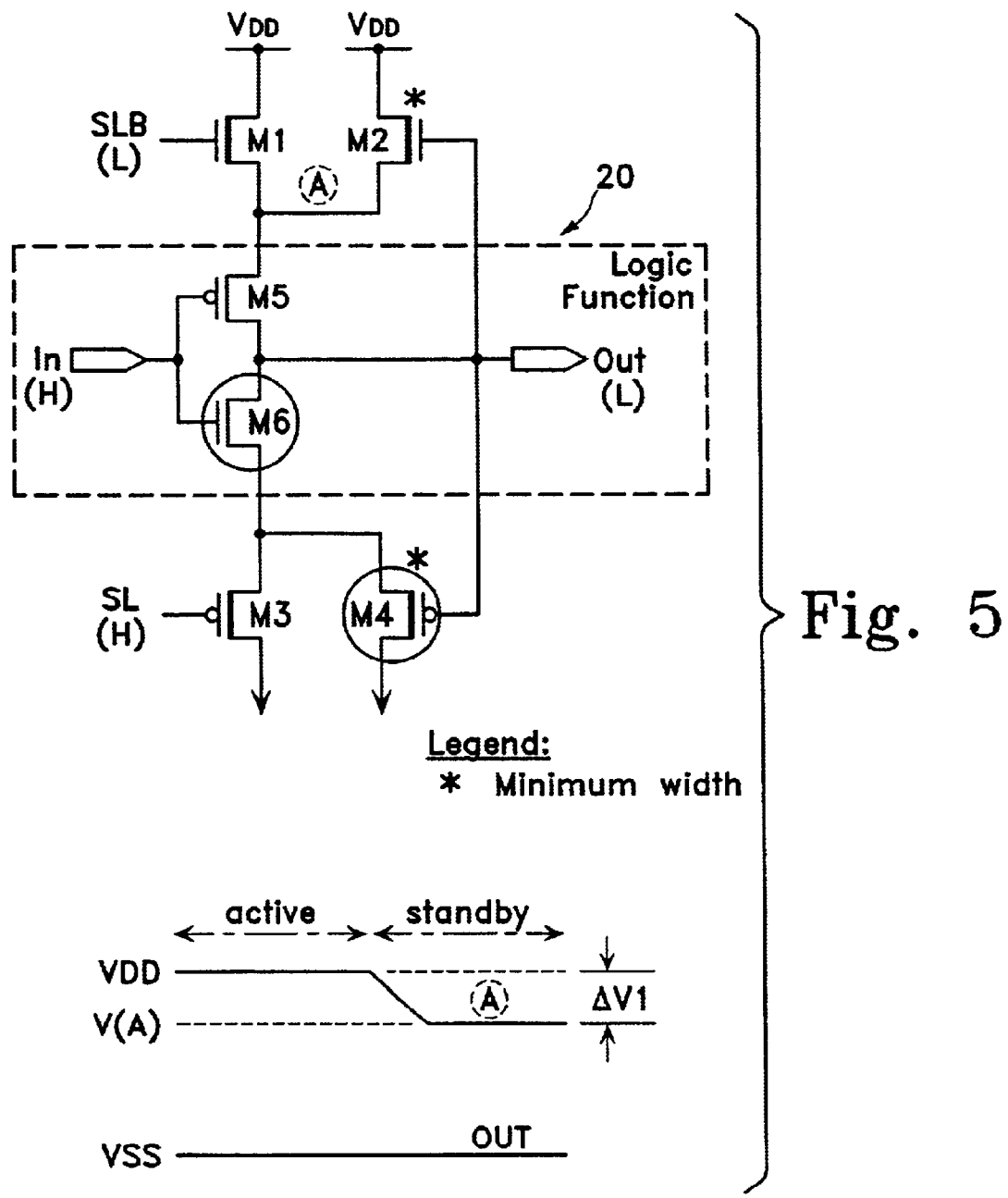

FIG. 5 illustrates the bias condition and node "A" voltage waveforms for control input 'High' (second logic state) in standby mode, thus making M5 turned off with Vgs=0V and M6 turned on. At the beginning of standby mode, SLB goes to LOW (logic 0) and SL to HIGH, (logic 1) respectively. M1 and M3 are turned off. M1 and M3 are reverse-biased initially by $|V_{DD}|$. Since leakage current of M5 is larger than that of M1 due to bias condition, node A voltage V(A) gradually drops by ΔV1. In other words, since Vgs of M5 is 0V initially, it leaks more leakage current after a LOW (logic 0) SLB input is applied to the gate of M1. The leakage continues until the voltage V(A) at node "A" falls to a level at which M5 is self-reverse biased, at which point both M1 and M5 are reverse biased, significantly suppressing sub-threshold leakage current during standby mode.

Following this drop in the voltage V(A), M1 & M2 are still reverse biased. Also, and Vgs of M5 is ΔV1. Thus, all transistors(M1, M2 and M5) are in a reverse-biased condition, and the leakage current flowing from $V_{DD}$ can be suppressed drastically. Meanwhile, depletion PMOS transistor, M4 with its gate connected to the output terminal (Out) of the multi-state circuit, is turned on since Out is low. Therefore, a strong output state (low) can be preserved safely through M4 and M6. Again depending on the nature of logic operation of the multi-state circuit, it is conceivable that both M2 and M4 can be omitted, especially for fast operation.

Figure 6:
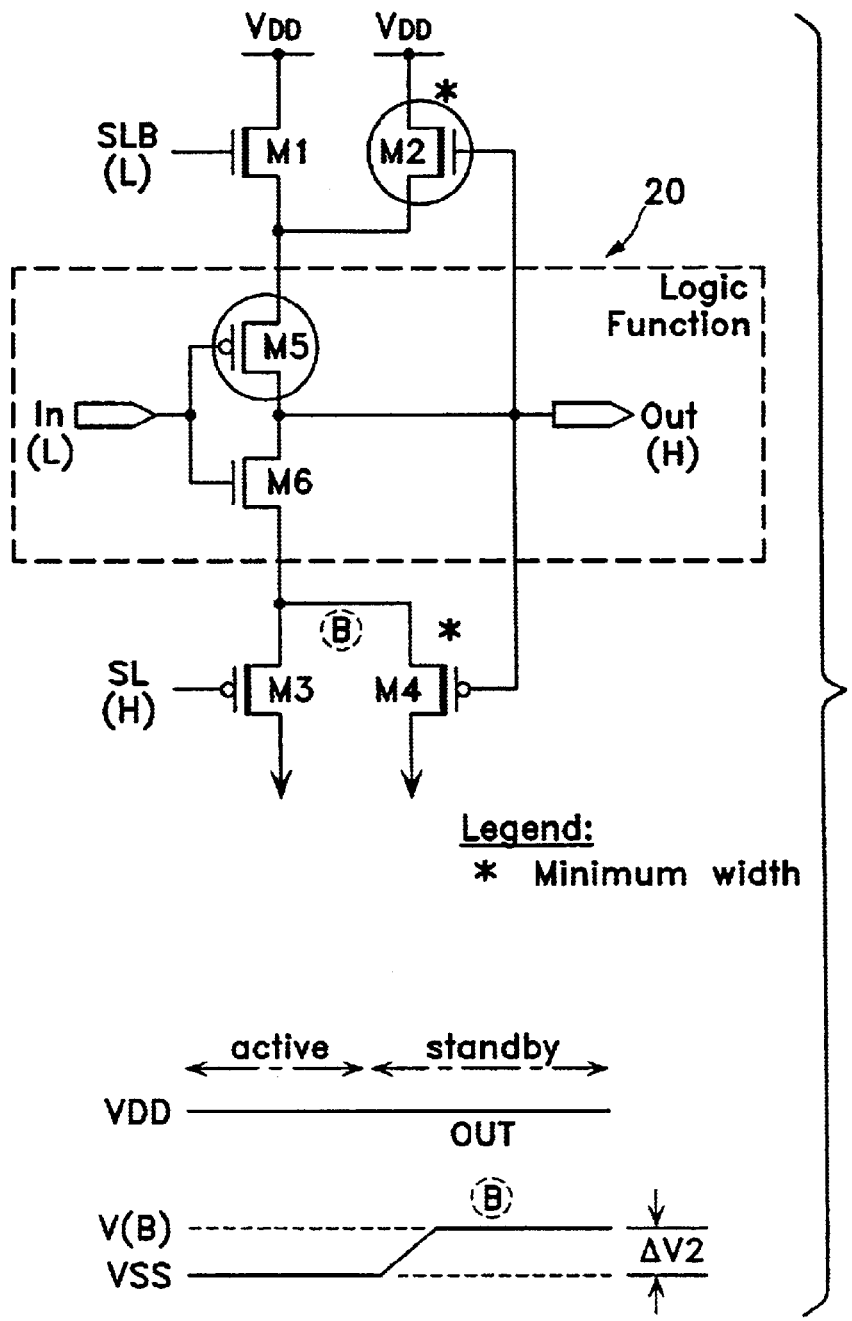
FIG. 6 is an illustrative circuit diagram of the circuit of FIG. 4 together with bias condition waveforms for node "B" for input 'Low' in standby mode in which M5 is turned on and M6 is turned off.

FIG. 6 illustrates the bias condition and node "B" voltage waveforms for input 'Low' (first logic state) in standby mode, thus making M5 turned on while M6 is turned off with Vgs=0V. At the beginning of the standby mode SLB goes LOW (logic 0) and SL goes HIGH (logic 1) causing M1 and M3 to turn off. After the circuit enters into standby mode, node "B" voltage rises to V(B) by ΔV2. Basically, since Vgs of M6 is initially 0V, it leaks more current after a HIGH (logic 1) SL input is applied to the gate of M3. The leakage continues until the voltage V(B) at node "B" rises to a level at which M6 is self-reverse biased, at which point both M3 and M6 are reverse biased, significantly suppressing sub-threshold leakage during standby mode.

Thus, following this rise in voltage V(B), M3 and M4 are still reverse biased. Also, Vgs of M6 is −ΔV2. Thus, all transistors (M3, M4 and M6) are in reverse-biased condition, and leakage current flowing from Out to $V_{SS}$ is suppressed. Meanwhile, depletion NMOS transistor, M2 with its gate connected to the output terminal (Out) of the multi-state circuit, is turned on since Out is high. Therefore, a strong output state, (high) is preserved safely through M2 and M5.

The relative sizes of transistors M1 and M5 can influence the self-reverse biasing of M1 when the standby mode is entered with the multi-state logic circuit in the second logic state. Similarly, the relative sizes of transistors M3 and M6 can influence the self-reverse biasing of M3 when the standby mode is entered with the multi-state logic circuit in the first logic state.

In general, the small sustaining transistors are most needed when the multi-state circuit input is not deterministic in the standby mode. In the structure shown in FIG. 4, two sustaining transistors, M2 and M4 are used since it is assumed that 'In' can be either high or low in the standby mode. However, if the input value 'In' can be deterministically fixed as either HIGH or LOW during standby, then these sustaining transistors are not required.

In one alternative embodiment, for example, if the input 'In' to the multi-state circuit can be deterministically set at a value that causes the multi-state circuit to be in the first state in the standby move, then the first PMOS transistor M5 always will be turned on, and the first NMOS transistor always will be turned off in the standby mode. In that case, the self-reverse bias condition always would be achieved using only the combination of the second PMOS transistor M3 and the first NMOS transistor M6. Transistors M1, M2 and M4 could be omitted.

In another alternative embodiment, for example, if the input 'In' to the multi-state circuit can be deterministically set at a value that causes the multi-state circuit to be in the second state in the standby move, then the first PMOS transistor M5 always will be turned off, and the first NMOS transistor always will be turned on in the standby mode. In that case, the self-reverse bias condition always would be achieved using only the combination of the second NMOS transistor M1 and the first NMOS transistor M5. Transistors M2, M3 and M4 could be omitted.

Thus, the invention is not intended to be limited as to require both a second NMOS power source transistor and a second PMOS power source transistor. If the state of the multi-state circuit in the standby mode can be deterministically set, then one or the other of the second power transistors can be omitted, and the sustaining transistors also can be omitted. The self-reversed bias will be achieved using the remaining power source transistor.

The new circuit of the first embodiment 20 of the invention can significantly suppress leakage current and while sustaining data information safely in standby mode without degrading performance and functionality in active mode. Moreover, it can achieve these results while using a relatively low supply voltage.

An HSPICE (simulation program, integrated circuit emphasis) computer simulation was performed to assess performance of the novel circuit 20 described above against the performance of earlier circuits. HSPICE simulation parameters are as follows. High Vt in MTCMOS is $|0.4V|$ while low Vt in all other cases $|0.2V|$ at $|V_{GS}|=|V_{DS}|=1V$. Boost voltage ($V_{PP}$) in SCCMOS $1.5*V_{DD}$ and substrate bias voltages in VTCMOS $|4*V_{DD}|$ in standby mode. Threshold voltages of depletion transistors in the novel circuit are 0.2V for PMOS and −0.2V for NMOS, respectively. In these simulations, the same effective source transistor size is used in MTCMOS, SCCMOS and in the novel circuit of the above embodiment of the invention.

Figure 7:
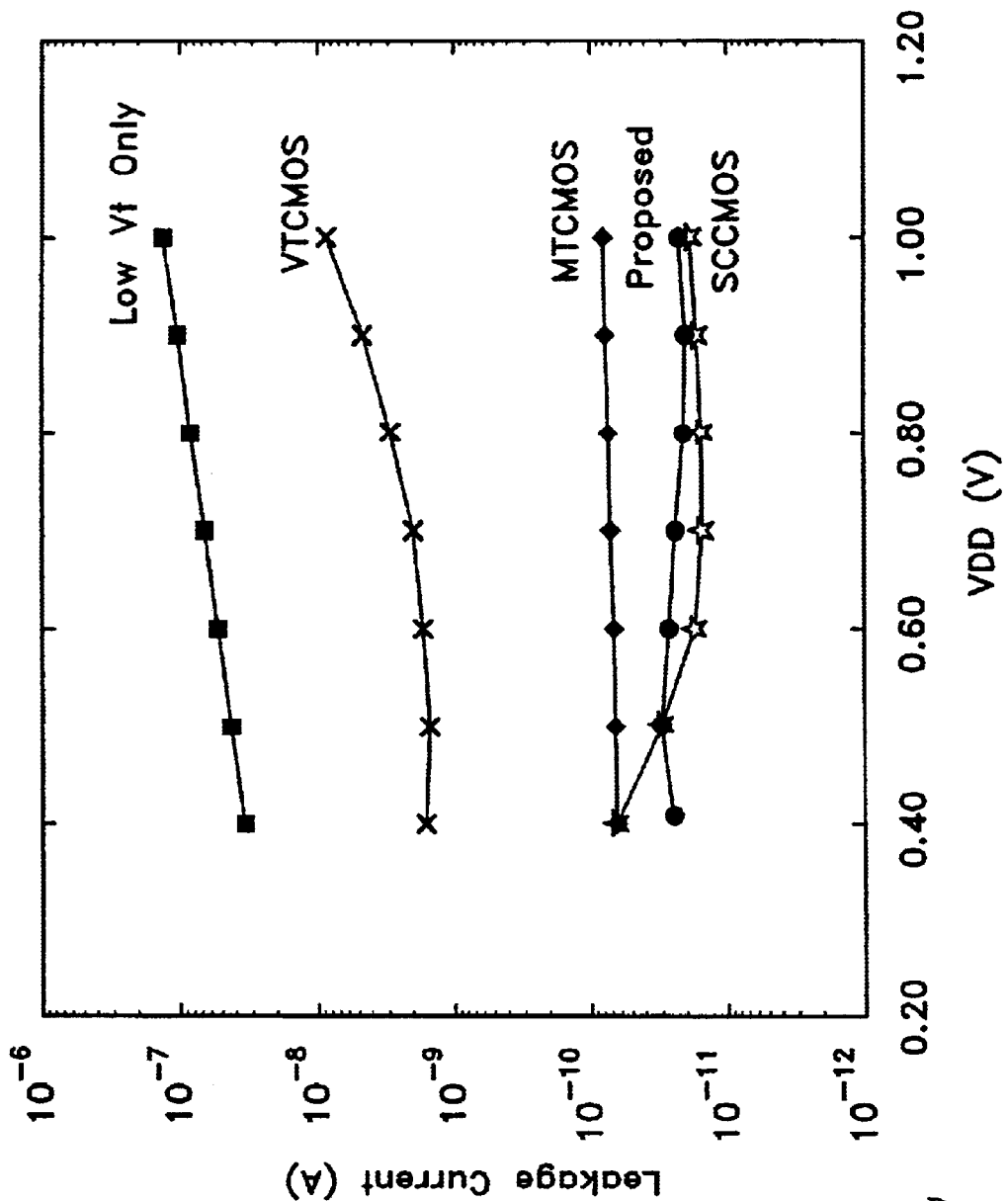
FIG. 7 compares simulation results illustrating leakage current in standby mode for several different for supply voltages.
Figure 8:
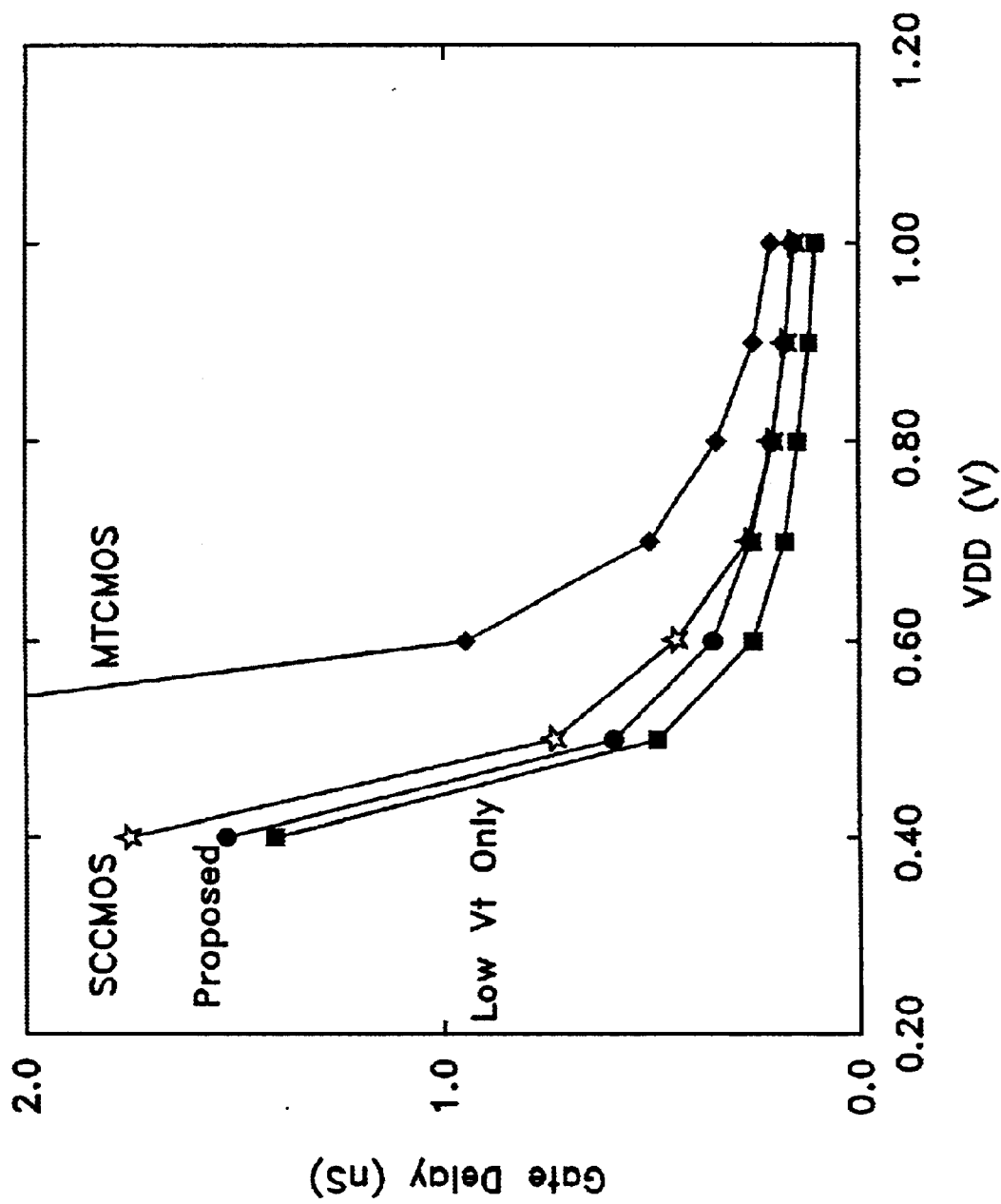
FIG. 8 compares simulation results illustrating gate delay in active mode for several different for supply voltages.

FIGS. 7 and 8 respectively show leakage current in standby mode and gate delay in active mode for several different for supply voltages. Gate delay is measured by using a ring oscillator with three fanouts at the output node of each stage. Leakage current can be reduced in MTCMOS due to the high Vt source transistor, but gate delay is large and it also increases greatly as supply voltage goes down for its small current driving capability. Except for the requirement of complicated data holding circuit and an on-chip boost generator, leakage current can be suppressed more in SCCMOS due to its reverse-biased source transistor. As supply voltage decreases, leakage current starts to increase when boost voltage ($V_{PP}$) is kept at $1.5*V_{DD}$. This results from the reduced reverse-bias voltage for the low Vt power source transistor. Therefore, keeping $V_{PP}$ level high without causing device reliability problems is a key design factor in SCCMOS. However, the novel circuit described above suppresses leakage current by about three orders of magnitude without much performance degradation compared to those of low Vt logic gate and increased of design and process complexity. Moreover, when on-chip bias voltages are applied for SL and SLB, performance can be improved further with reduced standby leakage current by using transistors with smaller threshold voltages.

Figure 9:
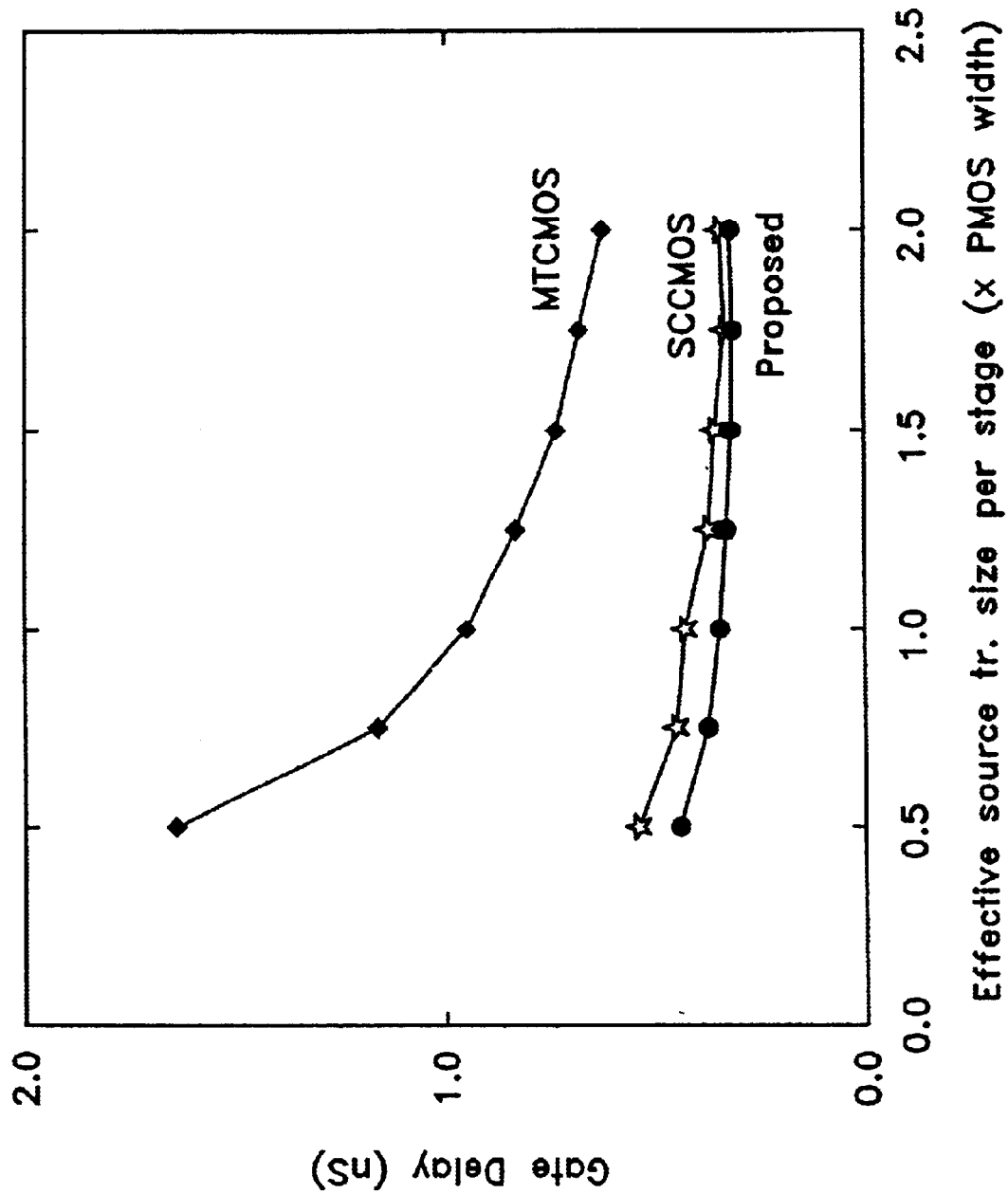
FIG. 9 compares simulation results for gate delay for different power source transistor sizes at $V_{DD}=0.6V$.

FIG. 9 illustrates gate delay results for different power source transistor sizes at $V_{DD}=0.6V$. The novel circuit 20 described above can use the smallest size source transistor, and it also shows the least dependence on power source transistor size variation.

Despite the high-performance and low power consumption benefits of the novel circuit 20 and related methods described with reference to FIGS. 4–6, there are some potential shortcomings that can be overcome with a somewhat different circuit that uses somewhat a different method of operation while still providing the same advantages described above. One potential shortcoming of the circuit of FIGS. 4–6 is that it uses depletion transistors or leaky enhancement transistors as power source transistors M1 and M2. The use of depletion transistors or leaky enhancement transistors in the first embodiment has the advantage of ensuring sufficient drive current in the active mode to promote full voltage swing of the low Vt enhancement transistors employed in the multi-state circuit. The use of low Vt transistors in the multi-state circuit permits improved performance through faster switching speeds. However, a potential disadvantage of the novel circuit of the first embodiment is the use of both enhancement ordinary transistors together with depletion (or leaky enhancement) type of transistors in the same integrated circuit. The use of two transistors types in the same circuit can require extra mask steps because the NMOS and PMOS depletion (or leaky enhancement) transistors have threshold voltages that are different from those of ordinary (non-leaky) enhancement NMOS and PMOS transistors. Thus, increased cost and time can be required to produce the novel circuit of the first embodiment described above.

As used herein, the term 'ordinary enhancement' transistor means that the transistor is in an off-state when a gate to source voltage of the transistor is smaller than a threshold voltage. As used herein, the term 'low threshold ordinary enhancement' transistor means that the transistor is in an off-state when a gate to source voltage of the transistor is smaller than a threshold voltage and the threshold voltage of the transistor is relatively smaller than that of other transistors integrated together on the same chip or on other typical semiconductor chips.

Figure 10:
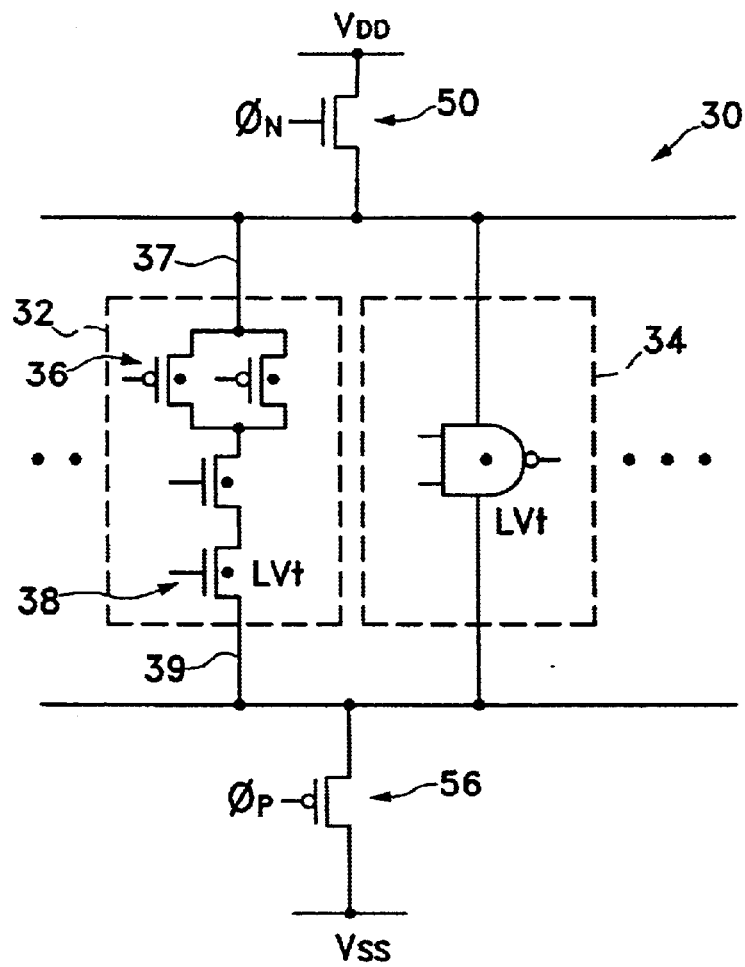
FIG. 10 is an illustrative circuit diagram of a second embodiment of the invention.

FIG. 10 is an illustrative circuit diagram of a second embodiment 30 of the invention which overcomes the possible shortcomings of the first embodiment. The second embodiment includes first and second multi-state circuits 32, 34 shown within dashed lines. The transistors comprising the multi-state circuits can be configured to perform virtually any logic function or storage function or both. The exact nature of multi-state circuit (logic and/or storage) function is unimportant to the invention. The illustrative first multistate circuit 30, comprises a multi-level logic tree including numerous PMOS and NMOS transistors. The first multi-state circuit 32 includes multiple first PMOS enhancement transistors 36 with a first terminal 37 connected to be biased with a supply voltage when in an active mode. The first multi-state circuit also includes a first NMOS enhancement transistor 38 with a first terminal 39 connected to be biased by an effective ground potential when in an active mode. Effective ground potential is used herein to signify the ground bias relative to the circuit. The second embodiment circuit 30 also includes a second power source enhancement NMOS transistor 50 connected between a supply voltage ($V_{DD}$ in a present embodiment) and the first terminal 37 of the first PMOS transistors 36. The second embodiment 30 also includes a second power source enhancement PMOS transistor 56 connected between the effective ground potential ($V_{SS}$ in a present embodiment) and the first terminal 39 of the first NMOS transistor 38.

Thus, the circuit 30 of the second embodiment differs from that of the first embodiment 20 in that the second embodiment 30 includes enhancement transistors rather than depletion transistors as its power source transistors. Also, the second embodiment circuit 30 does not include the small sustaining transistors, although they could be incorporated if the application required it. In addition, the second NMOS transistor 50 is shared among multiple first PMOS transistors 36 of the first multi-state circuit 32 and among one or more first PMOS transistors (not shown) of the second multi-state circuit 34. Similarly, the second PMOS transistor 56 is shared among the first NMOS transistor 38 of the first multi-state circuit 32 and among one or more first NMOS transistors (not shown) of the second multi-state circuit 34. Moreover, as explained above with reference to the first embodiment circuit 20 illustrated in FIG. 4, one or the other of the second NMOS transistor 50 or the second PMOS transistor 56 can be omitted if the first PMOS and first NMOS transistors can be put in a deterministic state in standby mode.

Figure 11:
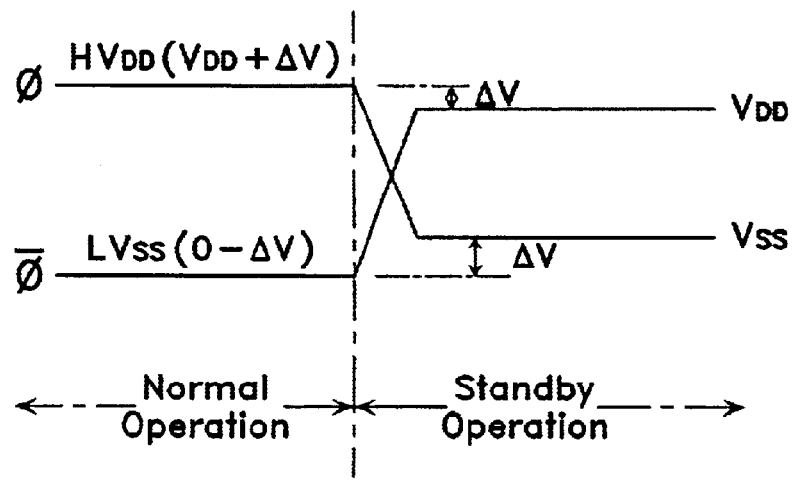
FIG. 11 is an illustrative drawing showing control signals $\phi_N$ and $\phi_P$ input to the respective gate terminals of the second NMOS transistor and the second PMOS transistor of the circuit of FIG. 10.

The method of operation of the circuit of the second embodiment 30 also differs from that of the first embodiment 20. Specifically, the control of the second power source enhancement NMOS transistor and the control of the second power source enhancement PMOS transistor are different from the control of corresponding depletion (or leaky enhancement) power source transistors of the circuit of the first embodiment. FIG. 11 shows the control signals $\phi_N$ and $\phi_P$ that are input to the respective gate terminals of the second NMOS transistor and the second PMOS transistor.

During active mode operation, $\phi_N$ drives the gate of the second enhancement NMOS transistor with an extra-high turn on voltage ($HV_{DD}$). In a present embodiment, the extra high turn on voltage is higher than the supply voltage ($V_{DD}$) applied to the first terminal of the first PMOS transistor through the second NMOS transistor by an amount ($\Delta V$) sufficient to the level of HVdd be at least a minimum voltage larger than Vdd that is sufficient to avoid any performance degradation. Similarly, during, active mode operation, $\phi_P$ drives the gate of the second enhancement PMOS transistor with an extra-low turn on voltage ($LV_{SS}$). In the current embodiment, the extra-low turn on voltage is lower than the effective ground ($V_{SS}$) applied to the first terminal of the first NMOS transistor by an amount ($\Delta V$) sufficient to avoid a performance penalty due to the extra PMOS power source transistor.

During standby mode operation, $\phi_N$ drives the gate of the second enhancement NMOS transistor with a low voltage that is not as low as the extra-low voltage level. Similarly, during standby mode operation, $\phi_P$ drives the gate of the second enhancement PMOS transistor with a high voltage that is not as high as the extra-high voltage level. In a present embodiment, during standby mode, the low voltage $\phi_N$ level and the high voltage $\phi_P$ level used to drive the respective gates of the NMOS and PMOS transistors are the supply voltage level $V_{DD}$ and the effective ground voltage $V_{SS}$ that are also used to bias the transistors of the multi-state circuits.

The extra-high voltage $HV_{DD}$ can be produced by an on-chip bootstrap circuit or by an external voltage generator. The extra-low voltage $LV_{SS}$ can be produced by on-chip or external negative voltage generator. The generation of the boosted and reduced voltages are well known to persons skilled in the art, form no part of the present invention, and therefore, are not described herein.

During active mode operation, driving the second power source enhancement NMOS transistor at the extra-high voltage level while also driving the second power source enhancement PMOS transistor at an extra-low voltage level ensures sufficient current drive through the second power source NMOS transistor and second power source PMOS transistor so that the low threshold enhancement transistors of the first and second multi-state circuits can operate over substantially the entire available logic voltage swing. It will be appreciated that the maximum available logic swing is between the supply voltage ($V_{DD}$) and effective ground ($V_{SS}$). The voltages on the respective input control terminals and the respective outputs of the first and second multi-state logic circuits 32, 34 are Vdd or Vss.

During standby mode operation, the second NMOS transistor 50 and second PMOS transistor 56 are turned off by respective lower level and higher level voltages. For example, during standby mode, assuming that the first PMOS transistors 36 receives a signal to turn off, and the first NMOS transistors 38 received a signal to turn on, then Vgs of NMOS 50 is initially –Vdd and Vgs of PMOS 36 initially is 0V. Since the leakage current of PMOS 36 is larger than that of NMOS 50 due to the bias condition, the voltage of the first terminal of PMOS 32 (source of PMOS 32) is lowered by ΔV and Vgs of PMOS becomes ΔV. Therefore NMOS 50 and PMOS 36 become reverse-biased as in FIGS. 4–5.

Operation in standby mode with first PMOS transistor 36 turned on and first NMOS transistor 38 turned off also can be understood from the description of the first circuit 20 with reference to FIGS. 4–5. Thus, leakage current is suppressed by a self-reverse bias mechanism during standby mode.

The method of controlling the circuit of the second embodiment has significant advantages in that, during standby mode operation, no on-chip boosted generator is required to generate a boosted voltage (e.g. $HV_{DD}$) to shut off a PMOS source transistor as shown in FIG. 1. Accordingly, there is also no need for a leakage compensation circuit to operate during standby mode to compensate for lowering of the boosted voltage due to leakage sources, e.g. the junction leakage current. Additionally there is no need for a detector circuit to operate during standby mode to control a level of a generated boosted voltage. For example, even though a target voltage boosted voltage might be 1.5V, if there was no detector to control this level, the voltage could rise to 2V, and an electric field across a gate oxide could become quite high, resulting in gate reliability problems. Therefore, if a boosted voltage was used during standby mode operation, then ordinarily, some amount of current would be consumed to generate and control such boosted voltage. This is typically would be tens of uA, and even when some other risky techniques (e.g. partial and sparse activation of the detector) are used, it still could constitute a big portion of the standby current.

Therefore, the control method explained with reference to the signal diagram of FIG. 11, uses boosted voltages (e.g., $HV_{DD}$) in active mode but not in standby mode. Even though boosted voltage power consumption may be tens of uA during active mode operation, this boosted voltage power consumption is negligible compared to active power consumption (tens or hundreds of mA). Therefore during standby mode, the circuit of the second embodiment consumes no additional power due to a generator or a detector of on-chip boosted voltages. Additionally, since $V_{DD}$ and $V_{SS}$ are used for NMOS and PMOS transistors in standby mode, respectively, the field across the oxide is just the same as that of normal transistors. Therefore, the second NMOS and second PMOS transistors of the new circuit of the second embodiment can be free from the reliability issues related with the gate oxide.

Even if a boosted voltage is applied to the gate (e.g., 2V), NMOS power source transistor is turned on. So NMOS transistor is turned on and there is a conducting channel whose potential is Vdd (e.g., 1V). Therefore, the net voltage across the oxide is not 2V but 1V. This is also an important feature of this invention. That is, even if a boosted voltage is used in the active mode, the net voltage difference across the gate oxide is not HVdd but Vdd, the device is free from the oxide reliability issue as in the standby mode. It should be noted that the voltage differences between HVdd and Vdd and between Vss and LVss need not be same in general, although FIG. 11 shows the same amount. The voltage differences are determined by the characteristics of the MOS transistor. Typically, the current driving capability of a PMOS transistor is about one-half of that of an NMOS transistor because of carrier mobility differences. Therefore, a larger difference ordinarily is required between $V_{SS}$ and $LV_{SS}$ than between $V_{DD}$ and $HV_{DD}$.

Figure 12:
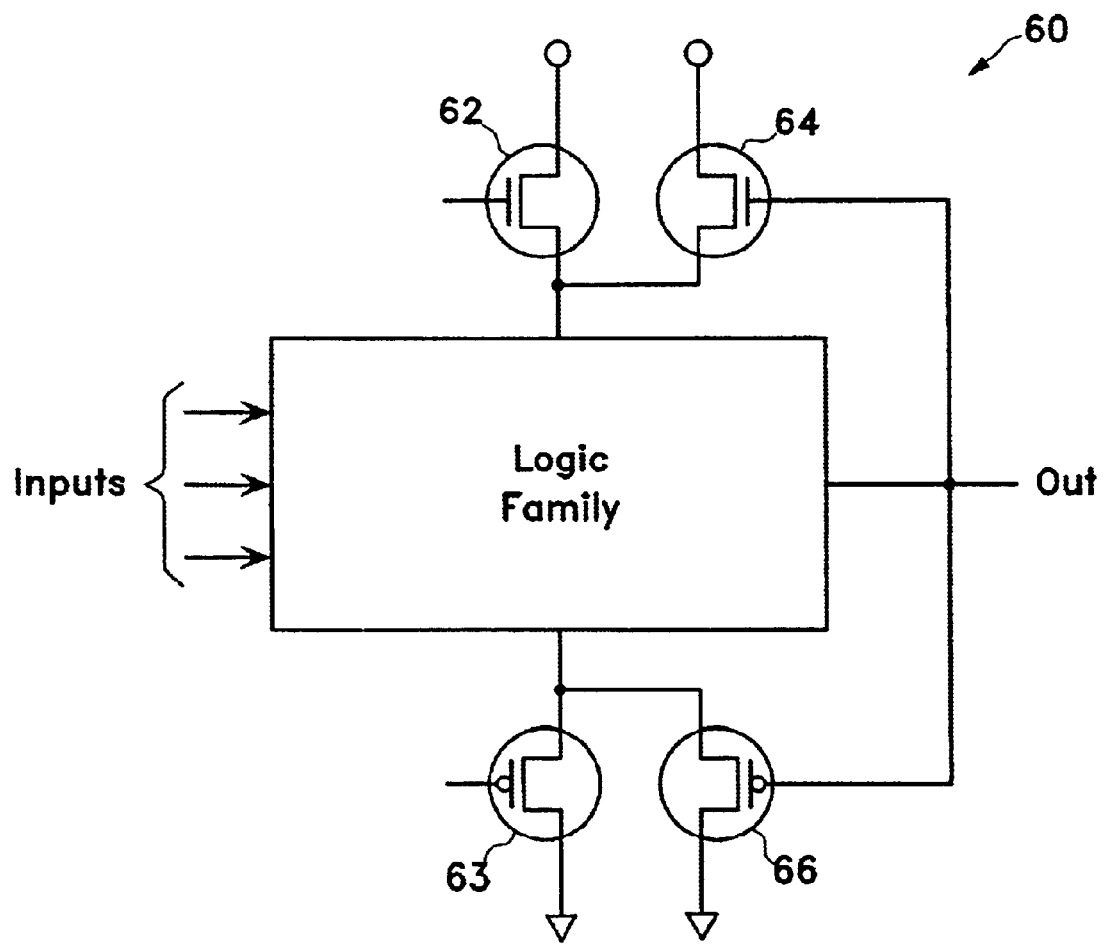
FIG. 12, is an illustrative circuit diagram of a third embodiment of the invention.

Referring to the illustrative circuit diagram of FIG. 12, there is shown a third embodiment 60 of the invention. The topology of the third embodiment 60 is basically the same as that of the first and second embodiments 20, 30. However, as in the second embodiment 30 the second NMOS and second PMOS power source transistors 62, 63 connected to the (arbitrary) logic family of the third embodiment 60 are enhancement type, and they are driven by control signals $\phi_N$ and $\phi_P$ respectively. The third embodiment 60 also includes a sustaining pull-up enhancement NMOS transistor 64 and a sustaining pull-down enhancement PMOS transistor 66. The role and operation of these two sustaining transistors 64, 66 is the same as that of the corresponding transistors of the first embodiment 20. In general, the sustaining transistors should have a minimum size which can flow larger amount current than junction leakage current.

Figure 13:
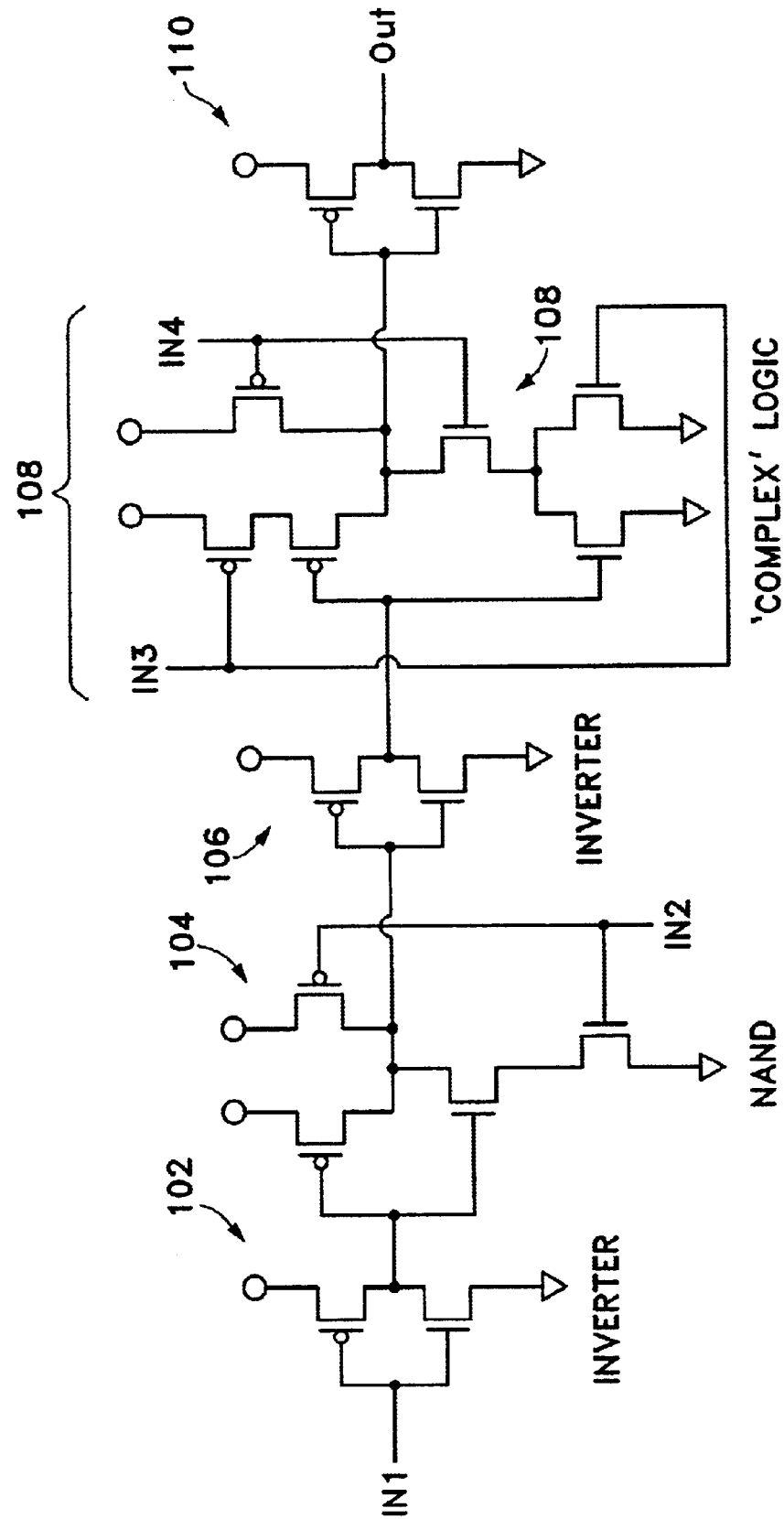
FIG. 13 is an illustrative circuit diagram of a hypothetical logic circuit 100 using a conventional transistor topology.

FIG. 13 is an illustrative circuit diagram of a hypothetical logic circuit 100 using a conventional transistor topology. The circuit 100 includes five smaller multi-state circuits: inverter 102, NAND gate 104, inverter 106, a 'complex' logic circuit 108 and inverter 110. The circuit 100 includes four inputs, IN1, IN2, IN3 and IN4. The circuit 100 includes one output labeled, OUT. The overall logic function performed by the circuit 100 is unimportant to the principles of the invention herein and, therefore, shall not be described.

Figure 14:
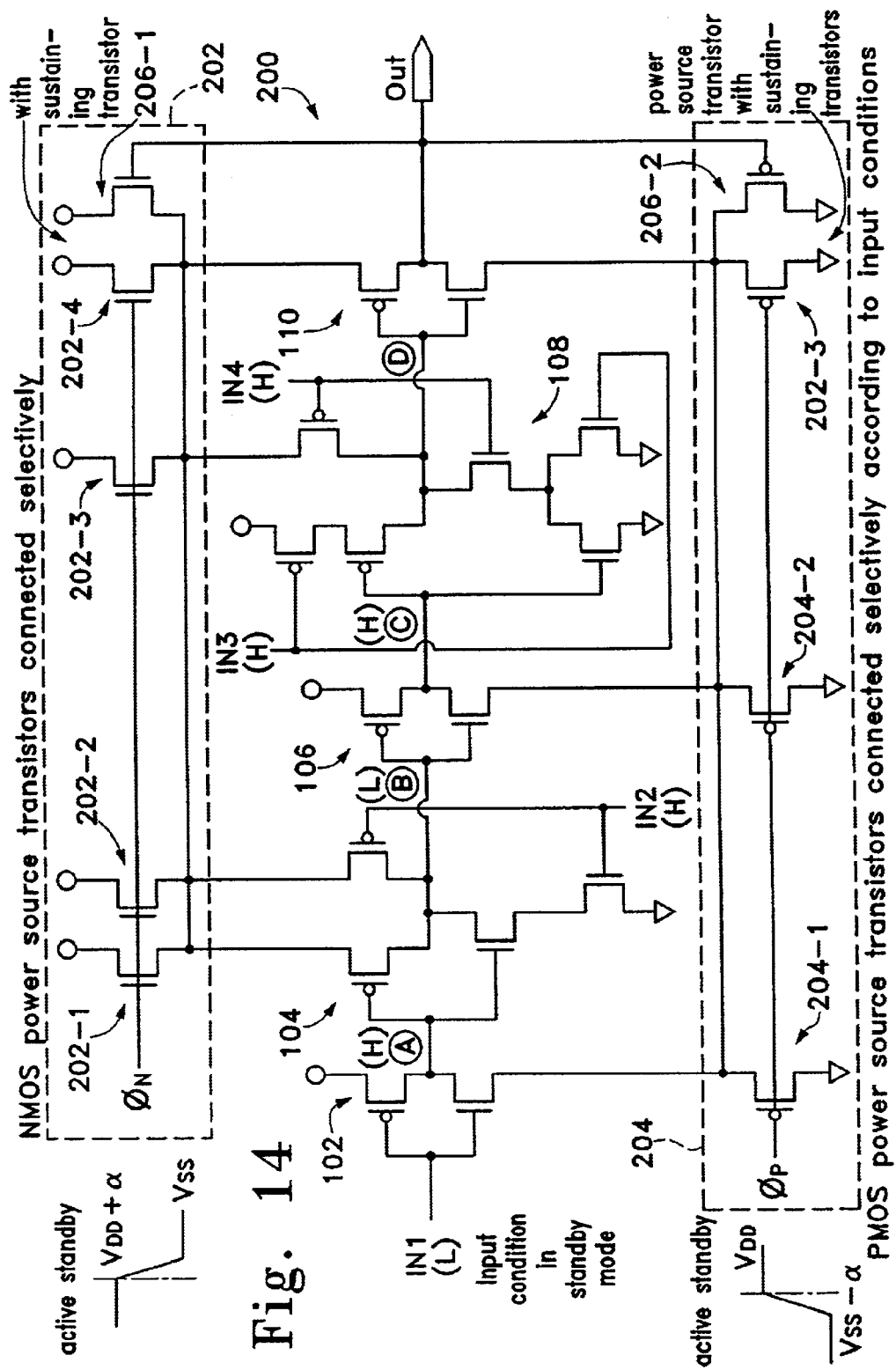
FIG. 14 is an illustrative circuit diagram of the circuit of FIG. 13 with the addition of NMOS power source transistors, PMOS power source transistors and sustaining transistors in accordance with the invention.

FIG. 14 is an illustrative circuit diagram of the circuit of FIG. 13 with the addition of NMOS power source transistors, PMOS power source transistors and sustaining transistors in accordance with the invention. The logic circuit 200 includes the same smaller multi-state circuits as circuit 100 which are labeled in FIG. 14 with the same reference numerals used in FIG. 13. Shown within the dashed lines 202 are NMOS power source transistors 202-1, 202-2, 202-3 and 202-4. Shown within dashed lines 204 are PMOS power source transistors 204-1, 204-2 and 204-3. A sustaining NMOS transistor 206-1 has a gate connected to the OUT terminal of the circuit 200. Similarly, a sustaining PMOS transistor 206-2 has a gate connected to the OUT terminal of the circuit 200. The gates of the NMOS power source transistors 202-1, 202-2, 202-3 and 202-4 are connected to receive control signal $\phi_N$ The gates of the PMOS power source transistors 204-1, 204-2 and 204-3 are connected to receive control signal $\phi_P$. Control signals $\phi_N$ and $\phi_P$ have waveforms such as that shown in FIG. 11.

It is assumed for the purpose of this example that inverter 102, NAND gate 104, inverter 106 and complex logic circuit 108 can be forced into deterministic logic states during standby mode. Hence, each of these smaller PMOS power source transistor. Specifically, a first NMOS transistor of inverter 102 is connected to a second PMOS power source transistor 204-1. The two first PMOS transistors of the NAND gate 104 are respectively connected to second NMOS power source transistors 202-1 and 202-2. The first NMOS transistor of inverter 106 is connected to second PMOS power source transistor 204-2. One of the first PMOS transistors of the complex logic circuit 110 is connected to a second PMOS power source transistor 202-3.

It is also assumed for the purpose of this example that inverter 110 has an indeterminate state during standby mode. Therefore, inverter 110 is connected to both an NMOS power source transistor 202-4 and to a PMOS power source transistor 202-3 and also is connected to an NMOS sustaining transistor 206-1 and to a PMOS sustaining transistor 206-2.

It is further assumed for the purpose of this example that in the standby mode, IN1=LOW; IN2=HIGH; IN2=HIGH; and IN4=HIGH. It is still further assumed that these inputs result in the following determinate states at the following nodes: A=HIGH, B=LOW and C=HIGH. It is also further assumed that the state of node D=indeterminate since it may depend on the state of IN4. When IN4 is high, D=LOW, but when IN4=LOW, D=HIGH. It will be appreciated that the state of the determinate state (HIGH/LOW) of a given smaller circuit determines whether that smaller circuit is connected to an NMOS source transistor or to a PMOS source transistor. For instance, in the standby mode, the first NMOS transistor of inverter 102 is deterministically turned off. Therefore, the first NMOS transistor is connected to a PMOS source transistor 204-1, and the first PMOS transistor of the inverter 102 is not connected to a power source transistor. Conversely, in the standby mode, the two first PMOS transistors of NAND gate 104 are deterministically turned off. Therefore, the two first PMOS transistors are respectively connected to NMOS source transistors 202-1 and 202-2. The first NMOS transistor of the NAND gate 104 is not connected to a power source transistor.

The principles of operation of the NMOS power source transistors, PMOS power source transistors and the sustaining transistors of FIG. 14 is fully explained with respect to FIGS. 4–6 and FIGS. 10–12, and will be understood from those explanations.

One advantage of connecting a multi-state circuit having a deterministic state in standby mode to only one power source transistor (either NMOS or PMOS depending on its state in standby mode), is increased performance. The use of both an NMOS power source transistor and a PMOS power source transistor rather than only one of the two, can add delay to the circuit. Although such delay might be slight, if the multi-state circuit is in a critical path, then its impact could be significant. Thus, for multi-state circuits located in a critical path, there is an advantage to deterministically driving the circuit to a known state in standby mode so as to obviate the need for both an NMOS transistor and a PMOS transistor in standby mode and to also obviate the need for sustaining transistors.

Various modifications to the preferred embodiments can be made without departing from the spirit and scope of the invention. Thus, the foregoing description is not intended to limit the invention which is described in the appended claims.

What is claimed is:

1. A method of limiting power consumption during operation of an integrated circuit including,
   a multi-state circuit that includes a first PMOS device and a first NMOS device, the multi-state circuit being operable to switch between a first tate in which the first PMOS device is turned on and the first NMOS device is turned off and a second state in which the first PMOS device is turned off and the first NMOS device is turned on;
   a second NMOS device with a drain connected to a supply voltage terminal and with a source connected to a source of the first PMOS device; and
   a second PMOS device with a drain connected to an effective ground terminal and with a source connected to a source of the first NMOS device, the method comprising:
   in the active mode,
   providing a turn on voltage signal to a gate of the second NMOS device that is higher than the multi-state circuit mipply voltage bias; and
   providing a turn on voltage signal to a gate of the second PMOS device that is lower than the multi-state circuit effective ground bias voltage; and
   in a standby mode,
   providing a turn off voltage signal to a gate of the second NMOS device that is not as low as the turn on voltage signal provided to the gate of the second PMOS device in the active mode; and
   providing a turn off voltage signal to a gate of the second PMOS device that is not as high as the turn on voltage signal provided to the gate of the second NMOS device in the active mode.

2. A method of limiting power consumption during operation of an integrated circuit including,
   a multi-state circuit that includes a first PMOS device and a first NMOS device, the multi-state circuit being operable to switch between a first state in which the first PMOS device is turned on and the first NMOS device is turned off and a second state in which the first PMOS device is turned off and the first NMOS device is turned on;
   a second NMOS device with a drain connected to a supply voltage terminal and with a source connected to a source of the first PMOS device; and
   a second PMOS device with a drain connected to an effective ground ternilnal and with a source connected to a source of the first NMOS device, the method comprising:
   in the active mode,
   providing a turn on voltage signal to a gate of the second NMOS device that is higher than the multi-state circuit supply voltage bias; and
   providing a turn on voltage signal to a gate of the second PMOS device that is lower than the multi-state circuit effective ground bias voltage; and
   in a standby mode,
   providing a turn off voltage signal to a gate of the second NMOS device that is equal to the multi-state circuit effective ground bias voltage; and
   providing a turn off voltage signal to a gate of the second PMOS device that is equal to the multi-state circuit supply voltage bias.

3. A method of limiting power consumption during operation of an integrated circuit including,
   a multi-state circuit that includes a first PMOS device and a first NMOS device, the multi-state circuit being operable to switch between a first state in which the first PMOS device is turned on and the first NMOS device is turned off and a second state in which the first PMOS device is turned off and the first NMOS device is turned on;
   a second NMOS device with a drain connected to a supply voltage terminal and with a source connected to a source of the first PMOS device; and
   a second PMOS device with a drain connected to an effective ground terminal and with a source connected to a source of the first NMOS device, the method comprising:
   in the active mode,
   providing high enough turn on voltage signal to a gate of the second NMOS device while providing a low enough turn on voltage signal to a gate of the second PMOS, to drive current sufficient to achieve a substantially full voltage swing whenever the multi-state circuit changes states in the active mode; and in a standby mode, providing a turn off voltage signal to the gate of the second NMOS device that is higher than the turn on voltage provided to the gate of the PMOS device in the active mode while providing a turn off voltage signal to the gate of the second PMOS device that is lower than the turn on voltage provided to the gate of the NMOS device in the active mode.

4. A method of limiting power consumption during operation of an integrated circuit including, a multi-state circuit that includes a first PMOS device and a first NMOS device, the multi-state circuit being operable to switch between a first state in which the first PMOS device is turned on and the first NMOS device is turned off and a second state in which the first PMOS device is turned off and the first NMOS device is turned on;

a second NMOS device with a drain connected to a supply voltage terminal and with a source connected to a source of the first PMOS device; and a second PMOS device with a drain connected to an effective ground terminal and with a source connected to a source of the first NMOS device, the method comprising:

in the active mode, providing high enough turn on voltage signal to a gate of the second NMOS device while providing a low enough turn on voltage signal to a gate of the second PMOS to drive current sufficient to achieve a substantially full voltage swing whenever the multi-state circuit changes states in the active mode; and in a standby mode, providing a turn off voltage signal to the gate of the second NMOS device that is equal to the multi-state circuit effective ground bias voltage while providing a turn off voltage signal to the gate of the second PMOS device that is equal to the multi-state circuit supply voltage bias.

5. A method of limiting power consumption during operation of an integrated circuit including:

a multi-state circuit connected to an effective ground terminal; and at least one mode control circuit transistor that serves as a power source transistor when the multi-state circuit is in an active mode and that serves as self-reverse biased cut-off transistor when the multi-state circuit is in the standby mode, consisting essentially of, one or more NMOS transistors, each with a source connected to the multi-state circuit and each with a drain connected to a supply voltage terminal, the method comprising:

in the active mode, providing a turn on voltage signal to a gate of the NMOS transistor that is higher than a supply voltage; and in a standby mode, providing a turn off voltage signal to a gate of the NMOS transistor that is lower than the supply voltage.

6. A method of limiting power consumption during operation of an integrated including:

a multi-state circuit connected to a supply voltage terminal; and at least one mode control circuit transistor tat serves a power ground source transistor when the multi-state circuit is in an active mode and that serves as self-reverse biased cut-off transistor when the multi-state circuit is in the standby mode, consisting essentially of, one or more PMOS transistors, each with a source connected to the multi-state circuit and each with drain connected to an effective ground voltage terminal, the method comprising:

in the active mode, providing a turn on voltage signal to a gate of the PMOS transistor that is lower than the effective ground voltage; and in a standby mode, providing a turn off voltage signal to a gate of the PMOS transistor that is higher than the effective ground voltage.

7. A method of limiting power consumption during operation of an integrated circuit including:

a multi-state circuit;

mode control circuit transistors that serve as power and power ground source transistors when the multi-state circuit is in an active mode and that serve as self-reverse biased cut-off transistors when the multi-state circuit is in the standby mode, consisting essentially of, one or more NMOS transistors, each with a source connected to the multi-state logic circuit and each with a drain connected to a supply voltage terminal; and one or more PMOS transistors, each with a source connected to the multi-state circuit and each with a drain connected to an effective ground voltage terminal, the method comprising:

in the active mode, providing a turn on voltage signal to a gate of the NMOS transistor that is higher than a supply voltage; and providing a turn on voltage signal to a gate of the PMOS transistor that is lower than the effective ground voltage; and in a standby mode, providing a turn off voltage signal to a gate of the NMOS transistor that is not lower than the effective ground voltage; and providing a turn off voltage signal to a gate of the PMOS transistor that is not higher than the supply voltage.

8. A method of limiting power consumption during operation of an integrated circuit including:

a multi-stale circuit connected to an effective ground terminal; and at least one mode control circuit transistor that serves as a power source transistor when the multi-state circuit is man active mode and that serves as self-reverse biased cut-off transistor when the multi-state circuit is in the standby mode, and one or more NMOS transistors, each with a source connected to the multi-state circuit and each with a drain connected to a supply voltage terminal the method comprising:

in the active mode, providing a turn on voltage signal to a gate of the NMOS transistor that is higher than a supply voltage; and in a standby mode.

providing a turn off voltage signal to a gate of the NMOS transistor that is equal to a multi-state circuit effective ground voltage.

9. A method of limiting power consumption during operation of an integrated circuit including:
- a multi-state circuit connected to an effective ground terminal; and
- at least one mode control circuit transistor that serves as a power source transistor when the multi-state circuit is in an active mode and that serves as self-reverse biased cut-off transistor when the multi-state circuit is in the standby mode, and
- one or more NMOS transistors, each with a source connected to the multi-state circuit and each with a drain connected to a supply voltage terminal, the method comprising:
- in the active mode,
- providing a high enough turn on voltage signal to a gate of the NMOS transistor to drive current sufficient to achieve substantially full voltage swing whenever the multi-state circuit change states in an active mode; and
- in a standby mode,
- providing a turn off voltage signal to a gate of the NMOS transistor that is lower than a supply voltage.

10. A method of limiting power consumption during operation of an integrated circuit including:
- a multi-state circuit connected to an effective ground terminal; and
- at least one mode control circuit transistor that serves as a power source transistor when the multi-state circuit is in an active mode and that serves as self-reverse biased cut-off transistor when the multi-state circuit is in the standby, and
- one or more NMOS transistors, each with a source connected to the multi-state circuit and each with a drain connected to a supply voltage terminal, the method comprising:
- in the active mode,
- providing a high enough turn on voltage signal to a gate of the NMOS transistor to drive current sufficient to achieve substantially full voltage swing whenever the multi-state circuit change states in an active mode; and
- in a standby mode,
- providing a turn off voltage signal to a gate of the NMOS transistor that is equal to a multi-state circuit effective ground voltage.

11. A method of limiting power consumption during operation of an integrated circuit including:
- a multi-state circuit connected to a supply voltage terminal; and
- at least one mode control circuit transistor that serves a power ground source transistor when the multi-state circuit is in an active mode and that serves as self-reverse biased cut-off transistor when the multi-state circuit is in the standby mode, and
- one or more PMOS transistors, each with a source connected to the multi-state circuit and each with drain connected to an effective ground voltage terminal, the method comprising:
- in the active mode,
- providing a turn on voltage signal to a gate of the PMOS transistor that is lower than an effective ground voltage; and
- in a standby mode,
- providing a turn off voltage signal to a gate of the PMOS transistor that is equal to a supply voltage.

12. A method of limiting power consumption during operation of an integrated circuit including:
- a multi-state circuit connected to a supply voltage terminal; and
- at least one mode control circuit transistor that serves a power ground source transistor when the multi-state circuit is in an active mode and that serves as self-reverse biased cut-off transistor when the multi-state circuit lain the standby mode, and,
- one or more PMOS transistors, each with a source connected to the multi-state circuit and each with drain connected to an effective ground voltage terminal, the method comprising:
- in the active mode,
- providing a low enough turn on voltage signal to a gate of the PMOS transistor to drive current sufficient to achieve a substantially full voltage awing whenever the multi-state circuit changes states in the active mode; and
- in a standby mode,
- providing a turn off voltage signal to a gate of the PMOS transistor that is higher than an effective ground voltage.

13. A method of limiting power consumption during operation of an integrated circuit including:
- a multi-state circuit connected to a supply voltage terminal; and
- at least one mode control circuit transistor that serves a power ground source transistor when the multi-state circuit is in an active mode and that serves as self-reverse biased cut-off transistor when the multi-state circuit is in the standby mode, and
- one or more PMOS transistors, each with a source connected to the multi-state circuit and each with drain connected to an effective ground voltage terminal, the method comprising:
- in the active mode,
- providing a low enough turn on voltage signal to a gate of the PMOS transistor to drive current sufficient to achieve a substantially full voltage swing whenever the multi-state circuit changes states in the active mode; and
- in a standby mode,
- providing a turn off voltage signal to a gate of the PMOS transistor that is equal to a multi-state circuit supply voltage.

* * * * *